US009870818B1

(12) United States Patent
Garg

(10) Patent No.: US 9,870,818 B1
(45) Date of Patent: Jan. 16, 2018

(54) SEPARATE READ AND WRITE ADDRESS DECODING IN A MEMORY SYSTEM TO SUPPORT SIMULTANEOUS MEMORY READ AND WRITE OPERATIONS

(71) Applicant: QUALCOMM Incorporated, San Diego, CA (US)

(72) Inventor: Manish Garg, Cary, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/429,842

(22) Filed: Feb. 10, 2017

Related U.S. Application Data

(60) Provisional application No. 62/403,740, filed on Oct. 4, 2016.

(51) Int. Cl.
  G11C 8/10   (2006.01)
  G11C 11/419   (2006.01)
  G11C 11/418   (2006.01)

(52) U.S. Cl.
  CPC .......... *G11C 11/419* (2013.01); *G11C 11/418* (2013.01)

(58) Field of Classification Search
  CPC ................................ G11C 11/419; G11C 8/10
  USPC ............................................. 365/154, 230.06
  See application file for complete search history.

(56) References Cited

U.S. PATENT DOCUMENTS

| 5,796,659 | A | 8/1998 | Hegi |
| 6,504,204 | B1 | 1/2003 | Hsu et al. |
| 7,623,404 | B2 | 11/2009 | Manickavasakam et al. |
| 7,724,574 | B2* | 5/2010 | Kim ...................... G11C 29/26 365/185.11 |
| 8,085,597 | B2 | 12/2011 | Yuda |
| 9,064,550 | B2 | 6/2015 | Chang et al. |
| 9,436,432 | B2 | 9/2016 | Batra et al. |
| 2004/0233714 | A1* | 11/2004 | Morikawa ................ G11C 7/22 365/185.04 |
| 2006/0126420 | A1 | 6/2006 | Kurumada et al. |
| 2012/0069625 | A1* | 3/2012 | Wada .................. G11C 11/5685 365/148 |
| 2012/0081969 | A1* | 4/2012 | Yang ..................... G11C 16/10 365/185.19 |

(Continued)

OTHER PUBLICATIONS

International Search Report and Written Opinion—PCT/US2017/050040—ISA/EPO—Nov. 16, 2017.

*Primary Examiner* — Michael Tran

(74) *Attorney, Agent, or Firm* — W&T/Qualcomm

(57) ABSTRACT

Memory systems that provide separate read and write address decoding to support simultaneous memory read and write operations are disclosed. Separating read and write address decoding can avoid circuit conflicts for a simultaneous memory read and write operation even if employing single port memory bit cells. The read and write addresses of respective read and write operations are separately decoded into read and write row and column selects driven to a memory array so that simultaneous read and write operations are not affected by each other. To avoid a circuit conflict for a simultaneous read and write operation, the memory system is configured to prioritize a write row select over a read row select to drive a row of memory bit cells in the memory array. In this manner, that write operation will always be successful regardless of whether the read and write row select are to the same row.

32 Claims, 9 Drawing Sheets

(56) References Cited

U.S. PATENT DOCUMENTS

| | | | | |
|---|---|---|---|---|
| 2012/0146120 A1* | 6/2012 | Han | ............... | H01L 27/11521 257/314 |
| 2013/0272052 A1* | 10/2013 | Kim | ............... | G11C 8/18 365/145 |
| 2014/0085972 A1* | 3/2014 | Ueda | ............... | G11C 13/0004 365/158 |
| 2014/0126301 A1* | 5/2014 | Yoon | ............... | G11C 29/40 365/189.04 |
| 2014/0126302 A1* | 5/2014 | Yoon | ............... | G11C 29/40 365/189.04 |
| 2015/0063040 A1* | 3/2015 | Chan | ............... | G11C 8/16 365/189.04 |
| 2015/0287474 A1* | 10/2015 | Yoon | ............... | G11C 17/18 365/96 |
| 2016/0189769 A1* | 6/2016 | Jeloka | ............... | G06F 12/00 365/154 |
| 2016/0315636 A1* | 10/2016 | Shinohara | ............... | H03M 13/1165 |
| 2017/0161143 A1* | 6/2017 | Reed | ............... | G06F 11/1068 |
| 2017/0200483 A1* | 7/2017 | Carissimi | ............... | G11C 7/22 |

\* cited by examiner

US 9,870,818 B1

SEPARATE READ AND WRITE ADDRESS DECODING IN A MEMORY SYSTEM TO SUPPORT SIMULTANEOUS MEMORY READ AND WRITE OPERATIONS

PRIORITY APPLICATION

The present application claims priority under 35 U.S.C. §119(e) to U.S. Provisional Patent Application Ser. No. 62/403,740 filed on Oct. 4, 2016, and entitled "SEPARATE READ AND WRITE ADDRESS DECODING IN A MEMORY SYSTEM TO SUPPORT SIMULTANEOUS MEMORY READ AND WRITE OPERATIONS," the contents of which is incorporated herein by reference in its entirety.

BACKGROUND

I. Field of the Disclosure

The technology of the disclosure relates generally to memory systems for processor-based systems, and more particularly to memory systems, such as static random access memory (SRAM) systems employing SRAM bit cells, capable of performing simultaneous memory read and write operations.

II. Background

Processor-based computer systems include memory for data storage. Different types of memory exist, each possessing certain unique features. For example, static random access memory (SRAM) is a type of memory that can be employed in processor-based computer systems. SRAM can store data without the need to periodically refresh the memory, unlike dynamic random access memory (DRAM) for example. An SRAM contains a plurality of SRAM bit cells (also referred to as "bit cells") organized in memory rows and columns in an SRAM array. For any given row in an SRAM array, each column of the SRAM array includes an SRAM bit cell in which a single data value or bit is stored. Memory read and write operations are performed on a particular SRAM bit cell using read and write word lines which correspond to the SRAM bit cell row that includes the particular SRAM bit cell.

FIG. 1 is a schematic diagram of an exemplary SRAM system 100 employing SRAM bit cells 102(0)(0)-102(M)(N) ("bit cells 102(0)(0)-102(M)(N)") for storing data in a data array 104. The data array 104 is organized as having 'N+1' bit cell columns and 'M+1' bit cell rows of bit cells 102 supporting an "N+1" bit wide data word. A bitline driver 106(0)-106(N) is provided for each bit cell column 0-N to drive a selected bitline (BL) 108T(0)-108T(N) and a complement bitline (BLB) 108C(0)-108C(N) for memory read and write operations. A wordline driver 110(0)-110(M) is provided for each bit cell row 0-M in the data array 104 to control access to the addressed bit cells 1020(0)-1020(N) in a given bit cell row 0-M based on an index(0)-index(M) decoded from a memory address indicating the bit cell row 0-M to be selected. A clock signal CLK 112 controls the timing of asserting an activated wordline 114(0)-114(M) to access a row of bit cells 1020(0)-1020(N) in the selected bit cell row 0-M. In a memory read operation, data bits 0-N and their complementary data bits are read out of the selected row of bit cells 1020(0)-1020(N) from their bitlines (BLs) 108T(0)-108T(N) and complement bitlines 108C(0)-108C(N). Sense amplifiers 116(0)-116(N) sense the differential voltages on the bitlines (BLs) 108T(0)-108T(N) and their respective complement bitlines 108C(0)-108C(N) to provide data output lines 118(0)-118(N) for the memory read operation. In a memory write operation, data bits 0-N to be written are provided to respective bitline drivers 106(0)-106(N) to drive the received data bits 0-N and their complement data bits onto the bitlines (BLs) 108T(0)-108T(N) and complement bitlines (BLBs) 108C(0)-108C(N), respectively. The wordline driver 114(0)-114(M) for the selected bit cell row 0-M is activated to select the memory bit cells 1020(0)-1020(N) to be written. The data bits 0-N asserted on the bitlines (BLs) 108T(0)-108T(N) and complement bitlines (BLBs) 108C(0)-108C(N), respectively, are written into the selected memory bit cells 1020(0)-1020(N).

FIG. 2 is a circuit diagram of an SRAM bit cell 102 provided in the SRAM system 100 in FIG. 1. The SRAM bit cell 102 is a standard six (6) transistor (T) (6T) static complement memory bit cell. The SRAM bit cell 102 comprises two (2) cross-coupled inverters 200(0), 200(1) powered by voltage Vdd. The cross-coupled inverters 200(0), 200(1) reinforce each other to retain data in the form of a voltage on a respective true storage node (T) 202T and a complement storage node (C) 202C. Each inverter 200(0), 200(1) is comprised of a respective pull-up P-type Field-Effect transistor (PFET) 204(0), 204(1) coupled in series to a respective pull-down N-type FET (NFET) 206(0), 206(1). NFET access transistors 208(0), 208(1) are coupled to the respective inverters 200(0), 200(1) to provide a respective read/write port 210T, and complement read/write port 210C to the SRAM bit cell 102. In a memory read operation, a bitline (BL) 108T and a complement bitline (BLB) 108C are pre-charged to voltage Vdd. Then, the wordline (WL) 114 coupled to gates G of the NFET access transistors 208(0), 208(1) is asserted to cause the NFET access transistors 208(0), 208(1) to pass voltages representing the data and complement data stored in the respective true storage node 202T and complement storage node 202C to the bitline (BL) 108T and complement bitline (BLB) 108C to be evaluated as a differential voltage. In a memory write operation, data and complement data to be written to the SRAM bit cell 102 is provided on the bitline (BL) 108T and complement bitline (BLB) 108C. Then, the wordline (WL) 114 is asserted to cause the NFET access transistors 208(0), 208(1) to pass the data represented as voltages from the bitline (BL) 108T and complement bitline (BLB) 108C on the true storage node 202T and the complement storage node 202C, respectively, to be stored.

Some computer architectures allow memory read and write operations to be issued concurrently to an SRAM array to increase throughput performance of the memory. However, the 6T SRAM memory bit cell 102 in FIG. 2 only has one read/write port 210T that can be used for either memory read or write operations at a given time. Thus, higher performance memory may be provided that allows simultaneous memory read and write operations. This higher performance memory may be used as cache memory in a processor-based system for example. FIG. 3 illustrates an adapted version of the SRAM bit cell 102 in FIG. 2 in the form of an eight (8) transistor (T) (8T) SRAM bit cell 300 that includes a separate read port 302 from the read/write port 210T for supporting simultaneous memory read and write operations. Thus, the SRAM bit cell 300 may be referred to as a one (1) read, one (1) write (1R1 W) SRAM bit cell 300. The NFET access transistors 208(0), 208(1) are write transistors for writing data from a write bit line (WBL) 304T and a complement write bit line (WBLB) 304C to the true and complement storage nodes 202T, 202C in response to a write word line (WWL) 306. The SRAM bit cell 300 also includes read NFET access transistors 308(0), 308(1) for supporting a memory read operation. In a memory read operation, a read word line (RWL) 310 is asserted, and the read NFET access transistor 308(0) is activated in response. The read NFET access transistor 308(1) is also activated if the data stored in the true storage node 202T is a logic '1' value. A read bit line (RBL) 312 is driven by the read NFBT access transistor 308(0) with the read data stored in the true storage node 202T. Collison detection circuitry may be provided to avoid read-write collisions when memory read and write operations are issued concurrently to the same SRAM bit cell 300 where the memory write operation may begin writing data to the SRAM bit cell 300 before the memory read operation is completed.

While multiple port SRAM bit cells, such as the 1R1 W SRAM bit cell 300 in FIG. 3, can be employed in SRAM systems to support simultaneous memory read and write operations, such SRAM bit cells are expensive in terms of power, performance, and area (PPA). The additional two (2) transistors provided in an 8T SRAM bit cell versus a 6T SRAM bit cell like in FIG. 2 consumes additional area and power. Performance is also affected by the additional resistance-capacitance (RC) delay resulting from the additional global routing needed to route larger memory bit cells. Thus, if it is desired to use an SRAM bit cell in a cache memory for example, using a multiple port SRAM bit cell such as the 1R1 W SRAM bit cell 300 in FIG. 3, the SRAM bit cell will have a reduced PPA over a single port 6T SRAM bit cell, which is more efficient in its PPA. However, a 6T SRAM bit cell cannot support simultaneous memory read and write operations.

SUMMARY OF THE DISCLOSURE

Aspects of the present disclosure involve separate read and write address decoding in a memory system to support simultaneous memory read and write operations. By separating read and write address decoding, a memory system can avoid circuit conflicts even if employing single port memory bit cells that only include one port for conducting memory read and write operations. It may be desired to employ single port memory bit cells in the memory system as a non-limiting example to minimize power, performance, and area (PPA) of the memory system.

In this regard, in exemplary aspects disclosed herein, a memory system includes a memory array comprising a plurality of memory bit cells organized in memory bit cell rows and columns. The memory bit cells may be static random access memory (SRAM) bit cells as a non-limiting example. The read and write address of respective memory read and write operations requested from the memory system are separately decoded and driven to the memory array so that simultaneous memory read and write operations are not affected by each other. In this regard, for a memory read operation, the memory system is configured to decode the read address into a read row select and a read column select to select the column of memory bit cells in the memory bit cell row of the read address for the memory read operation. For a memory write operation, the memory system is configured to decode the write address into a write row select and a write column select to select the column of memory bit cells in the memory bit cell row of the write address for the memory write operation. Thus, each memory address for the memory read and write operation can be accessed according to their respective, separately decoded read and write row and column selects. However, multiple memory bit cell rows cannot be selected in the memory array in response to a memory write operation, because the write data will be written to multiple memory bit cells rows (i.e., more than one memory address location) in an undesired manner. Thus, in examples disclosed herein, the memory system is configured to prioritize the write row select for the memory write operation over the read row select for selecting the memory bit cell row to be accessed. If the read and write row select are to the same memory bit cell row, both read data for the memory read operation and the write data for the memory write operation in a simultaneous memory read and write operation will be valid. However, if read and write row selects are not to the same memory bit cell row, only the memory write operation can be relied upon as being successful since the memory system prioritizes the write row select over the read row select to avoid a circuit conflict from selecting multiple memory bit cell rows in the memory array. The memory write operation is successful regardless of whether there is a simultaneous memory read and write operation to the same or different memory bit cell columns.

In other exemplary aspects disclosed herein, even though a simultaneous memory read and write operation will provide for a memory write operation to always be successful, it may nevertheless be desired to also minimize the occurrence of simultaneous memory read and write operations to increase memory read operation success. In this regard, the memory array in the memory system may be segregated into a number of memory sub-arrays each having a storage size less than the overall storage size of the memory system. Simultaneous memory read and write operations are supported when such memory read and write operations are to memory addresses in different memory sub-arrays without any need to prioritize a write row select over a read row select for a memory write operation. For example, the organization of memory sub-arrays may be based on statistic knowledge of locality of addresses accessed in memory read and write operations. For example, a cache memory may exhibit a strong locality of reference for memory read and write operations. However, if simultaneous memory read and write operations are to an address in the same memory sub-array, the memory sub-arrays can be configured to separate read and write address decoding as discussed above to support simultaneous memory read and write operations. This may allow the memory sub-arrays to be sized larger than otherwise in memory systems that do not separate read and write address decoding to minimize complexity in routing and PPA of the memory system.

In this regard, in one exemplary aspect, a memory bit cell selection circuit for a memory system is provided. The memory bit cell selection circuit is configured to, in response to a memory write operation, receive a write row select indicating a memory bit cell row among a plurality of memory bit cell rows in a memory array corresponding to a memory write address for the memory write operation. The memory bit cell selection circuit is also configured to, in response to the memory write operation, receive a write column select indicating a memory bit cell column among a plurality of memory bit cell columns in the memory array corresponding to the memory write address for the memory write operation. The memory bit cell selection circuit is also configured to, in response to the memory write operation, select the memory bit cell column of memory bit cells in the memory array addressed by the write column select. The memory bit cell selection circuit is also configured to, in response to the memory write operation, generate a read/write row select indicating the memory write operation. The memory bit cell selection circuit is also configured to, in response to the memory write operation, select the memory bit cell row of memory bit cells in the memory array addressed by the write row select in response to the read/write row select indicating the memory write operation. The memory bit cell selection circuit is also configured to, in response to a memory read operation, receive a read row select indicating a memory bit cell row among the plurality of memory bit cell rows in the memory array corresponding to a memory read address for the memory read operation. The memory bit cell selection circuit is also configured to, in response to the memory read operation, receive a read column select indicating a memory bit cell column among the plurality of memory bit cell columns in the memory array corresponding to the memory read address for the memory read operation. The memory bit cell selection circuit is also configured to, in response to the memory read operation, select the memory bit cell column of memory bit cells in the memory array addressed by the read column select. The memory bit cell selection circuit is also configured to, in response to the memory read operation, generate a read/write row select indicating the memory read operation in response to the memory write operation not being present for the memory read operation. The memory bit cell selection circuit is also configured to, in response to the memory read operation, select the memory bit cell row of the memory bit cells in the memory array addressed by the read row select in response to the read/write row select indicating the memory read operation.

In another exemplary aspect, a memory bit cell selection circuit for a memory system is provided. The memory bit cell selection circuit comprises a means for receiving a write row select indicating a memory bit cell row among a plurality of memory bit cell rows in a memory array corresponding to a memory write address for a memory write operation. The memory bit cell selection circuit also comprises a means for receiving a write column select indicating a memory bit cell column among a plurality of memory bit cell columns in the memory array corresponding to the memory write address for the memory write operation. The memory bit cell selection circuit also comprises a means for selecting the memory bit cell column of memory bit cells in the memory array addressed by the means for receiving the write column select. The memory bit cell selection circuit also comprises a means for generating a read/write row select indicating the memory write operation. The memory bit cell selection circuit also comprises a means for receiving a read row select indicating a memory bit cell row among the plurality of memory bit cell rows in the memory array corresponding to a memory read address for a memory read operation. The memory bit cell selection circuit also comprises a means for receiving a read column select indicating a memory bit cell column among the plurality of memory bit cell columns in the memory array corresponding to the memory read address for the memory read operation. The memory bit cell selection circuit also comprises a means for selecting the memory bit cell column of memory bit cells in the memory array addressed by the means for receiving the read column select. The memory bit cell selection circuit also comprises a means for generating a read/write row select indicating the memory read operation in response to the memory write operation not being present for the memory read operation. The memory bit cell selection circuit also comprises a means for selecting the memory bit cell row of the memory bit cells in the memory array addressed by the write row select in response to the means for generating the read/write row select indicating the memory write operation. The memory bit cell selection circuit also comprises a means for selecting the memory bit cell row of the memory bit cells in the memory array addressed by the read row select in response to the means for generating the read/write row select indicating the memory read operation.

In another exemplary aspect, a method of performing a memory read and write operation to a memory array in a memory system is provided. The method comprises receiving a write row select indicating a memory bit cell row among a plurality of memory bit cell rows in a memory array corresponding to a memory write address for a memory write operation. The method also comprises receiving a write column select indicating a memory bit cell column among a plurality of memory bit cell columns in the memory array corresponding to the memory write address for the memory write operation. The method also comprises receiving a read row select indicating a memory bit cell row among the plurality of memory bit cell rows in the memory array corresponding to a memory read address for a memory read operation. The method also comprises receiving a read column select indicating a memory bit cell column among the plurality of memory bit cell columns in the memory array corresponding to the memory read address for the memory read operation. The method also comprises selecting the memory bit cell column of memory bit cells in the memory array addressed by the write column select. The method also comprises selecting the memory bit cell column of memory bit cells in the memory array addressed by the read row select. The method also comprises generating a read/write row select indicating the memory write operation in response to the memory write operation being present. The method also comprises selecting the memory bit cell row of the memory bit cells in the memory array addressed by the write row select in response to the read/write row select indicating the memory write operation.

In another exemplary aspect, a memory system is provided. The memory system comprises a memory array comprising a plurality of memory bit cells organized into a plurality of memory bit cell rows and a plurality of memory bit cell columns. The memory system also comprises a read/write decoder circuit. The read/write decoder circuit is configured to decode a memory read address in a memory read operation into a read row select indicating a memory bit cell row among the plurality of memory bit cell rows in the memory array corresponding to the memory read address, and a read column select indicating a memory bit cell column among the plurality of memory bit cell columns in the memory array corresponding to the memory read address. The read/write decoder circuit is configured to decode a memory write address a memory write operation into a write row select indicating a memory bit cell row among the plurality of memory bit cell rows in the memory array corresponding to the memory write address, and a write column select indicating a memory bit cell column among the plurality of memory bit cell columns in the memory array corresponding to the memory write address. The memory system also comprises at least one memory bit cell selection circuit. Each memory bit cell selection circuit is configured to, in response to the memory write operation, select a memory bit cell column among the plurality of memory bit cell columns in the memory array addressed by the write column select. Each memory bit cell selection circuit is also configured to, in response to the memory write operation, generate a read/write row select indicating the memory write operation. Each memory bit cell selection circuit is further configured to, in response to the memory write operation, select a memory bit cell row among the plurality of memory bit cell rows in the memory array addressed by the write row select in response to the read/write row select indicating the memory write operation. Each memory bit cell selection circuit is configured to, in response to the memory read operation, select a memory bit cell column among the plurality of memory bit cell columns in the memory array addressed by the read column select. Each memory bit cell selection circuit is also configured to, in response to the memory read operation, generate a read/write row select indicating the memory read operation in response to the memory write operation not being present for the memory read operation. Each memory bit cell selection circuit is also configured to, in response to the memory read operation, select a memory bit cell row of memory bit cells in the memory array addressed by the read row select in response to the read/write row select indicating the memory read operation.

DETAILED DESCRIPTION

Figure 1:
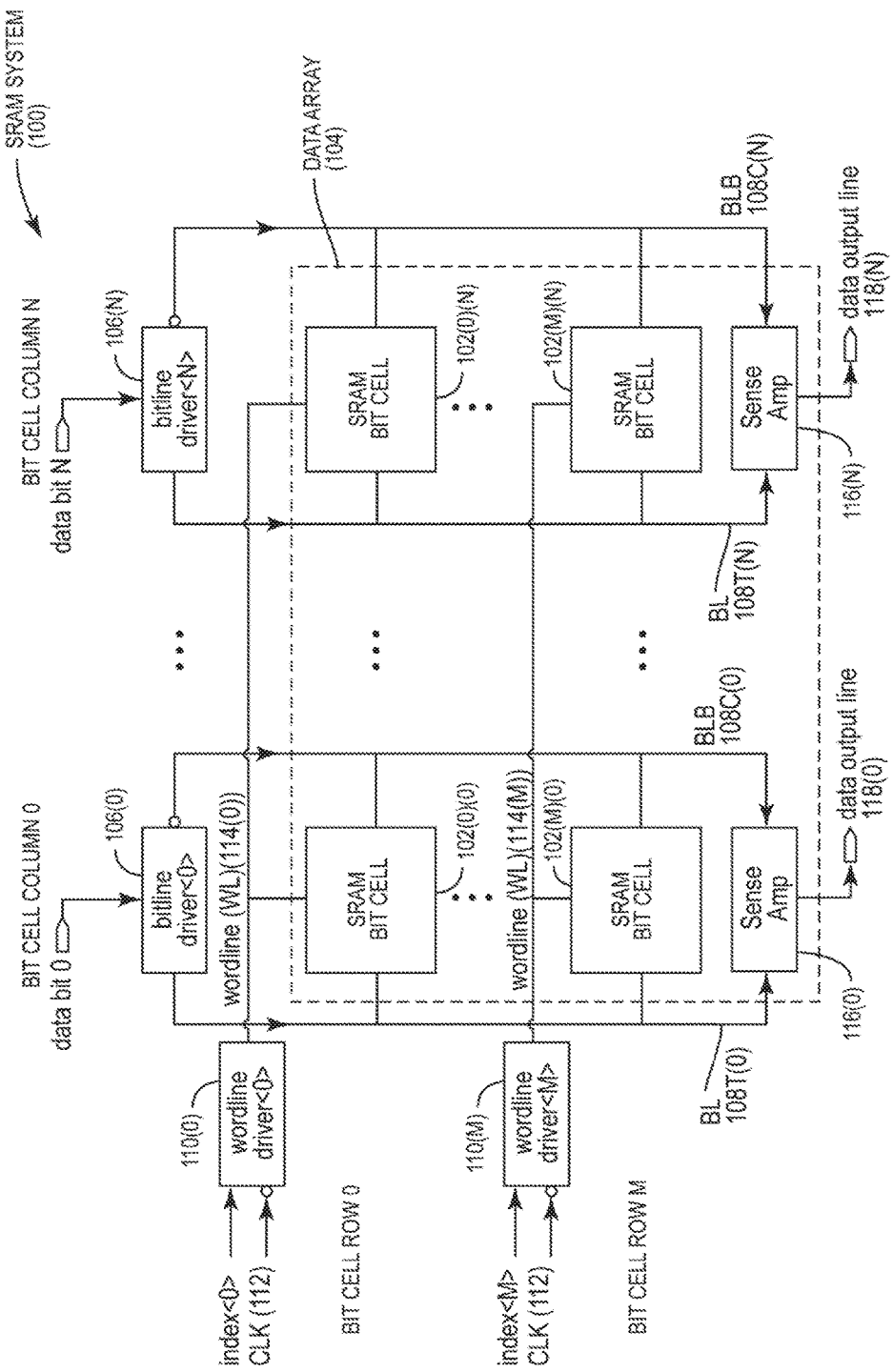
FIG. 1 is a schematic diagram of an exemplary processor-based memory system employing a static random access memory (SRAM) system comprising a data array of static memory bit cells organized in bit cell rows and columns for storing data.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects of the present disclosure involve separate read and write address decoding in a memory system to support simultaneous memory read and write operations. By separating read and write address decoding, a memory system can avoid circuit conflicts even if employing single port memory bit cells that only include one port for conducting memory read and write operations. It may be desired to employ single port memory bit cells in the memory system as a non-limiting example to minimize power, performance, and area (PPA) of the memory system.

In this regard, in exemplary aspects disclosed herein, a memory system includes a memory array comprising a plurality of memory bit cells organized in memory bit cell rows and columns. The memory bit cells may be static random access memory (SRAM) bit cells as a non-limiting example. The read and write address of respective memory read and write operations requested from the memory system are separately decoded and driven to the memory array so that simultaneous memory read and write operations are not affected by each other. In this regard, for a memory read operation, the memory system is configured to decode the read address into a read row select and a read column select to select the column of memory bit cells in the memory bit cell row of the read address for the memory read operation. For a memory write operation, the memory system is configured to decode the write address into a write row select and a write column select to select the column of memory bit cells in the memory bit cell row of the write address for the memory write operation. Thus, each memory address for the memory read and write operation can be accessed according to their respective, separately decoded read and write row and column selects. However, multiple memory bit cell rows cannot be selected in the memory array in response to a memory write operation, because the write data will be written to multiple memory bit cells rows (i.e., more than one memory address location) in an undesired manner. Thus, in examples disclosed herein, the memory system is configured to prioritize the write row select for the memory write operation over the read row select for selecting the memory bit cell row to be accessed. If the read and write row select are to the same memory bit cell row, both read data for the memory read operation and the write data for the memory write operation in a simultaneous memory read and write operation will be valid. However, if read and write row selects are not to the same memory bit cell row, only the memory write operation can be relied upon as being successful since the memory system prioritizes the write row select over the read row select to avoid a circuit conflict from selecting multiple memory bit cell rows in the memory array. The memory write operation is successful regardless of whether there is a simultaneous memory read and write operation to the same or different memory bit cell columns.

Figure 4:
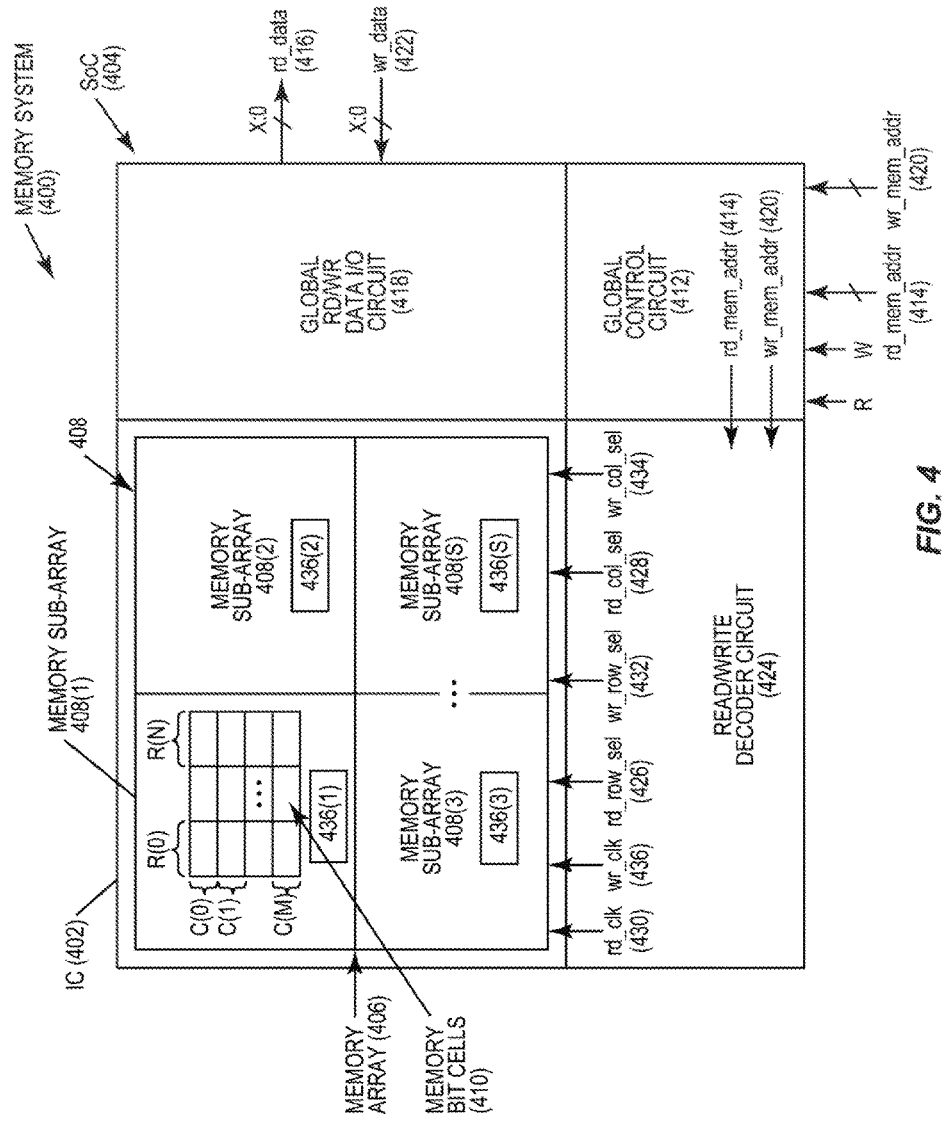
FIG. 4 is a circuit diagram of an exemplary memory system that can be provided in a processor-based system, wherein the memory system includes one or more memory sub-arrays and a global decoder circuit configured to separately decode read and write addresses into read and write row and column selects, and wherein each memory sub-array is configured to prioritize a write row select over a read row select to support simultaneous memory read and write operations to the memory sub-array.

FIG. 4 is a diagram of an exemplary memory system 400 that can be provided in a processor-based system to support memory read and write operations for storing data. The memory system 400 may be provided in an integrated circuit (IC) 402. Further, the memory system 400 may be provided as part of a system-on-a-chip (SoC) 404 with a processor and other processor-based components. The memory system 400 is configured to perform memory read and write operations to memory bit cells in a memory array 406 in response to a memory read and write requests from a processor or other master device. For example, the memory system 400 may be a cache memory accessible by a processor in a processor-based system for storing and retrieving cached data. The memory array 406 may include one or more memory sub-arrays 408(1)-408(S) each containing memory bit cells 410 that are accessible for memory read and write operations. Each memory sub-array 408(1)-408(S) is a uniquely addressable subset of the addressable space in the memory array 406 in this example. The memory bit cells 410 are shown for the memory sub-array 408(1) as an example. As shown therein, the memory bit cells 410 are organized in memory bit cell rows R(0)-R(N) and memory bit cell columns C(0)-C(M). The memory sub-arrays 408(1)-408(S) may be configured to provide their own dedicated access circuit such that memory operations performed in one memory sub-array 408(1)-408(S) are independent of memory operations performed in another memory sub-array 408(1)-408(S). For example, if the memory system 400 is provided in a processor-based system that supports simultaneous memory read and write operations, memory read and write operations that are addressed to different memory sub-arrays 408(1)-408(S) can be performed simultaneously in their respective memory sub-arrays 408(1)-408(S) without interfering with each other.

With continuing reference to FIG. 4, the memory system 400 in this example includes a global control circuit 412. The global control circuit 412 is configured to receive memory operation requests. In this regard, the global control circuit 412 is configured to receive a read signal R to indicate a memory read request to the memory system 400 to perform a memory read operation. The global control circuit 412 is configured to receive a memory read address (rd_mem_addr) 414 in response to the memory read operation to indicate the memory address of the memory bit cells 410 in the memory array 406 to be read. Read data (rd_data) 416 of X+1 bits (X:0) at the memory read address (rd_mem_addr) 414 in the memory array 406 is provided to a global read/write (RD/WR) data input/output (I/O) circuit 418, which can then be provided to the requesting device in the processor-based system. For example, X+1 bits may be the word size access in the memory array 406. The global control circuit 412 is also configured to receive a write signal W to indicate a memory write request to the memory system 400 to perform a memory write operation. The global control circuit 412 is configured to receive a memory write address (wr_mem_addr) 420 in response to the memory read operation to indicate the memory address of the memory bit cells in the memory array 406 to be written. Write data (wr_data) 422 of X+1 bits (X:0) to be written in the memory bit cells 410 at the memory write address (wr_mem_addr) 420 in the memory array 406 is provided to the global RD/WR data I/O circuit 416.

The size of the memory sub-arrays 408(1)-408(S) can be selected to provide the desired statistical occurrence of simultaneous memory read and write operations addressed to different memory sub-arrays 408(1)-408(S). The smaller the size of the memory sub-arrays 408(1)-408(S) to the overall addressable memory space, the greater the likelihood of simultaneous memory read and write operations being addressed to different memory sub-arrays 408(1)-408(S). However, as discussed in more detail below, the memory system 400 in FIG. 4 is configured to separately decode the memory read address (rd_mem_addr) 414 and memory write address (wr_mem_addr) 420 for respective memory read and write operations to allow memory read and write operations to the same memory sub-array 408(1)-408(S) to be performed simultaneously. Thus, as an example, this may allow the number of separated memory sub-arrays 408(1)-408(S) to be reduced including down to one (1) memory sub-array 408, while supporting simultaneous memory read and write operations. Further, as will be discussed in more detail below, separately decoding the memory read address (rd_mem_addr) 414 and memory write address (wr_mem_addr) 420 for respective memory read and write operations can allow use of single port memory bit cells 410, which may have a reduced area over multiple port memory bit cells 410 that may require more area for more transistors and thus involve more complex routing, thereby being more inefficient in terms of PPA.

In this regard, with continuing reference to FIG. 4, to access the memory bit cell 410 in the memory array 406 at the memory read address (rd_mem_addr) 414 in the memory array 406 in response to a memory read operation, the global control circuit 412 provides the memory read address (rd_mem_addr) 414 to a read/write decoder circuit 424. The read/write decoder circuit 424 is global to all the memory sub-arrays 408(1)-408(S) in this example. The read/write decoder circuit 424 is configured to separately decode the memory read address (rd_mem_addr) 414 into a read row select (rd_row_sel) 426 indicating a memory bit cell row R among a plurality of memory bit cell rows R(0)-R(N) in the memory array 406 corresponding to the memory read address (rd_mem_addr) 414. The read/write decoder circuit 424 is also configured to decode the memory read address (rd_mem_addr) 414 into a read column select (rd_col_sel) 428 indicating a memory bit cell column C among the plurality of memory bit cell columns C(0)-C(M) in the memory array corresponding to the memory read address (rd_mem_addr) 414. The read/write decoder circuit 424 is also configured to generate a read clock signal (rd_clk) 430 to be provided to the memory array 406 to clock circuits therein involved in controlling the reading of data from the selected memory bit cells 410 at the selected row R and column C according to the read row select (rd_row_sel) 426 and the read column select (rd_col_sel) 428.

Similarly, for a memory write operation, the global control circuit 412 provides the memory write address (wr_mem_addr) 420 to the read/write decoder circuit 424. The read/write decoder circuit 424 is configured separately decode the memory write address (wr_mem_addr) 420 into a write row select (wr_row_sel) 432 indicating a memory bit cell row R among a plurality of memory bit cell rows R(0)-R(N) in the memory array 406 corresponding to the memory write address (wr_mem_addr) 420. The read/write decoder circuit 424 is also configured to decode the memory write address (wr_mem_addr) 420 into a write column select (wr_col_sel) 434 indicating a memory bit cell column C among the plurality of memory bit cell columns C(0)-C(M) in the memory array 406 corresponding to the memory write address (wr_mem_addr) 420. The read/write decoder circuit 424 is also configured to generate a write clock signal (wr_clk) 436 to be provided to the memory array 406 to clock circuits therein involved in controlling the writing of data to the selected memory bit cells 410 at the selected row R and column C according to the write row select (wr_row_sel) 432 and the write column select (wr_col_sel) 434.

By the read/write decoder circuit 424 in the memory system 400 in FIG. 4 separately decoding the memory read address (rd_mem_addr) 414 and memory write address (wr_mem_addr) 420 for respective memory read and write operations, the memory array 406 is configured to handle simultaneous memory read and write operations addressed to the same memory sub-array 408(1)-408(S). The read row select (rd_row_sel) 426 and the read column select (rd_col_sel) 428 are generated separately and independently from the write row select (wr_row_sel) 432 and the write column select (wr_col_sel) 434. In this regard, a memory bit cell selection circuit 436(1)-436(S) in an addressed memory sub-array 408(1)-408(S) uses the read row select (rd_row_sel) 426 and the read column select (rd_col_sel) 428 to select a memory bit cell row R and memory bit cell column C of memory bit cells 410 in the addressed memory sub-array 408(1)-408(S) for a memory read operation. The memory bit cell selection circuit 436(0)-436(S) in the addressed memory sub-array 408(1)-408(S) also uses the write row select (wr_row_sel) 432 and the write column select (wr_col_sel) 434 to independently select a memory bit cell row R and memory bit cell column C of memory bit cells 410 in the addressed memory sub-array 408(1)-408(S) for a memory write operation.

Even though the read/write decoder circuit 424 in FIG. 4 is configured to separately generate the read row select (rd_row_sel) 426 and the read column select (rd_col_sel) 428 for a memory read operation and the write row select (wr_row_sel) 432 and the write column select (wr_col_sel) 434 for a memory write operation to allow a memory sub-array 408(1)-408(S) to support simultaneous memory read and write operations, different memory bit cell rows R(0)-R(N) cannot be selected at the same time for a memory write operation. Otherwise, the write data (wr_data) 422 provided for the memory write operation will overwrite multiple selected memory bit cell rows R(0)-R(N) in an unintended manner. Thus, to avoid this circuit conflict in the memory array 406 for a simultaneous memory read and write operation, the memory bit cell selection circuits 436(1)-436(S) in the memory sub-arrays 408(1)-408(S) in FIG. 4 are configured to prioritize the write row select (wr_row_sel) 432 over the read row select (rd_row_sel) 426 to drive the row R of memory bit cells 410 in the memory array 406. Thus, in a simultaneous memory read and write operation, the write data (wr_data) 422 gets written into the memory bit cells 410 for the selected memory bit cell row R according to the write address (wr_mem_addr) 420 as priority. Thus, if the read row select (rd_row_sel) 426 and write row select (wr_row_sel) 432 are to the same memory bit cell row R, the write data (wr_data) 422 for the memory write operation and the read data (rd_data) 416 for the memory write operation will be valid. However, if read row select (rd_row_sel) 426 and write row select (wr_row_sel) 432 are not to the same memory bit cell row R, only the memory write operation can be relied upon as being successful since the memory bit cell selection circuits 436(1)-436(S) prioritize the write row select (wr_row_sel) 432 over the read row select (rd_row_sel) 426 for a simultaneous memory read and write operation to the same memory sub-array 408(1)-408(S). In this manner, the memory write operation is successful regardless of whether there is a simultaneous memory read and write operation to the same or different memory bit cell columns C(0)-C(M).

Figure 5:
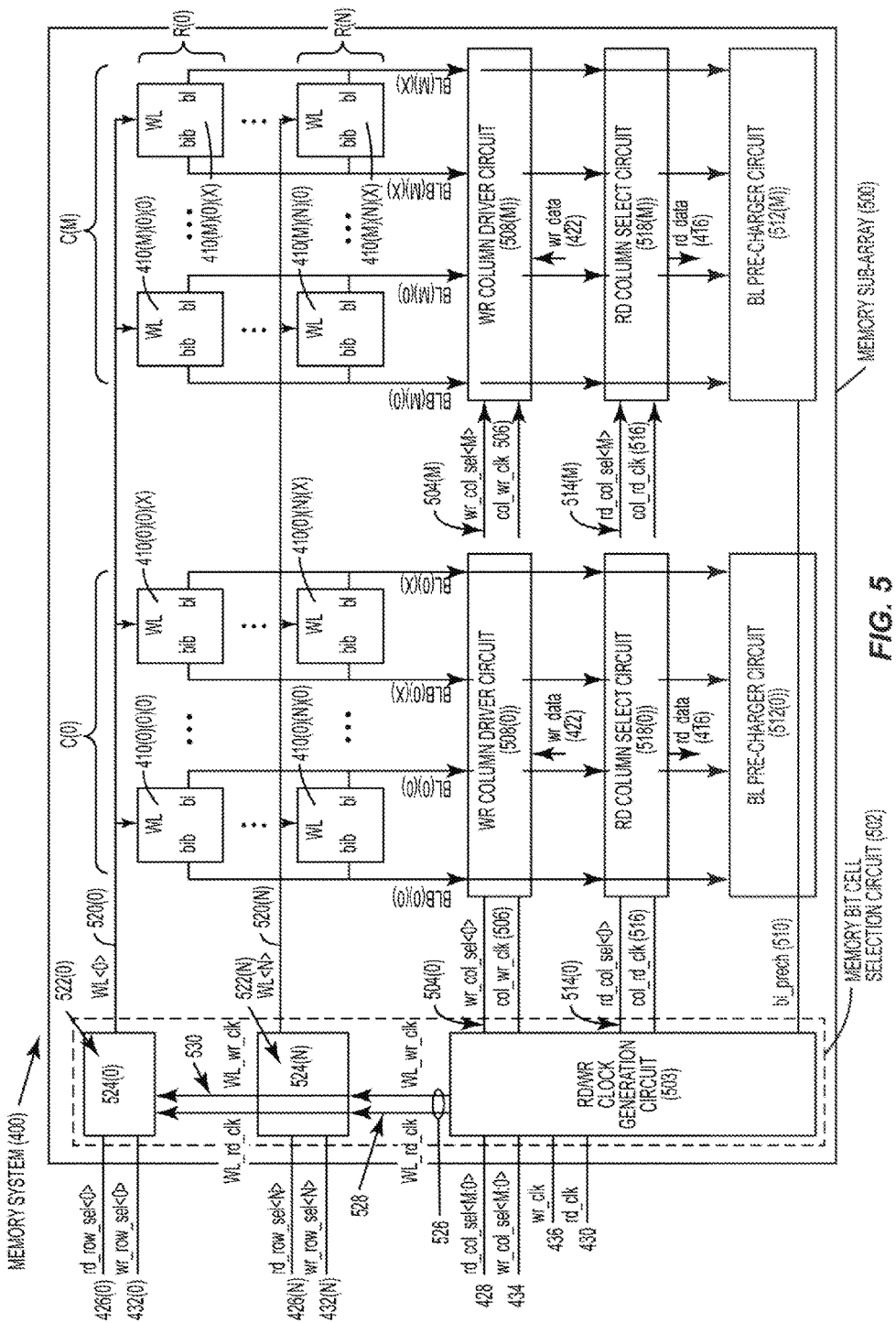
FIG. 5 is an exemplary circuit diagram of a memory sub-array that can be provided in the memory system in FIG. 4, wherein the memory sub-array includes a read/write clock generation circuit for generating a separate read and write clock for respective memory read and write operations, and row select circuits configured to select between a read row select and a write row select for driving an associated memory bit cell row.

To provide more exemplary detail of a memory bit cell selection circuit that can be provided in a memory sub-array to receive separately decoded read and write addresses from memory read and write operations, and prioritize a write row select over a read row select to support simultaneous memory read and write operations, FIG. 5 is provided. FIG. 5 an exemplary circuit diagram of a memory sub-array 500 that can be provide in the memory system 400 in FIG. 4. The memory sub-array 500 includes a memory bit cell selection circuit 502. The memory sub-array 500 can be included as any of the memory sub-arrays 408(1)-408(S) in the memory system 400 in FIG. 4. The memory bit cell selection circuit 502 can be provided as any of the memory bit cell selection circuits 436(1)-436(S) in the memory sub-arrays 408(1)-408(S) in FIG. 4.

With reference to FIG. 5, the memory bit cell selection circuit 502 is configured to receive the read row select (rd_row_sel) 426, the read column select (rd_col_sel) 428 and the read clock (rd_clk) 430 in response to a memory read operation addressed to a memory read address in the memory sub-array 500. The memory bit cell selection circuit 502 is also configured to receive the write row select (wr_row_sel) 432, the write column select (wr_col_sel) 434 and the write clock (wr_clk) 436 in response to a memory write operation addressed to a memory write address in the memory sub-array 500. If a memory read and write operation is to memory read and write addresses both in the memory sub-array 500, the memory bit cell selection circuit 502 separately receives the read row select (rd_row_sel) 426, the read column select (rd_col_sel) 428 and the read clock (rd_clk) 430, and the write row select (wr_row_sel) 432, the write column select (wr_col_sel) 434 and the write clock (wr_clk) 436 for both the memory read and write operations.

Figure 2:
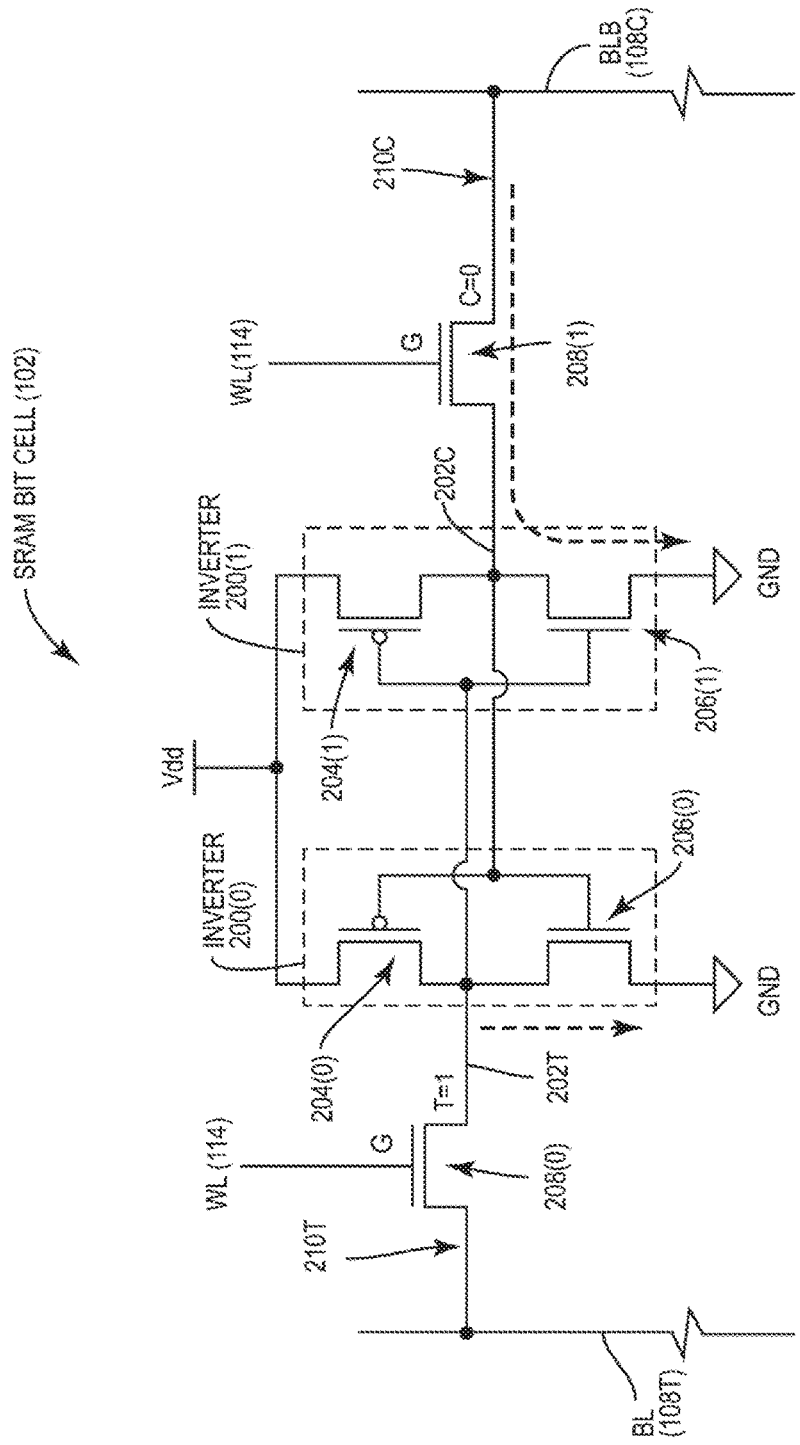
FIG. 2 is a circuit diagram of a single port, six (6) transistor (T) (6T) SRAM bit cell that can be employed in the data array in the SRAM system in FIG. 1.
Figure 3:
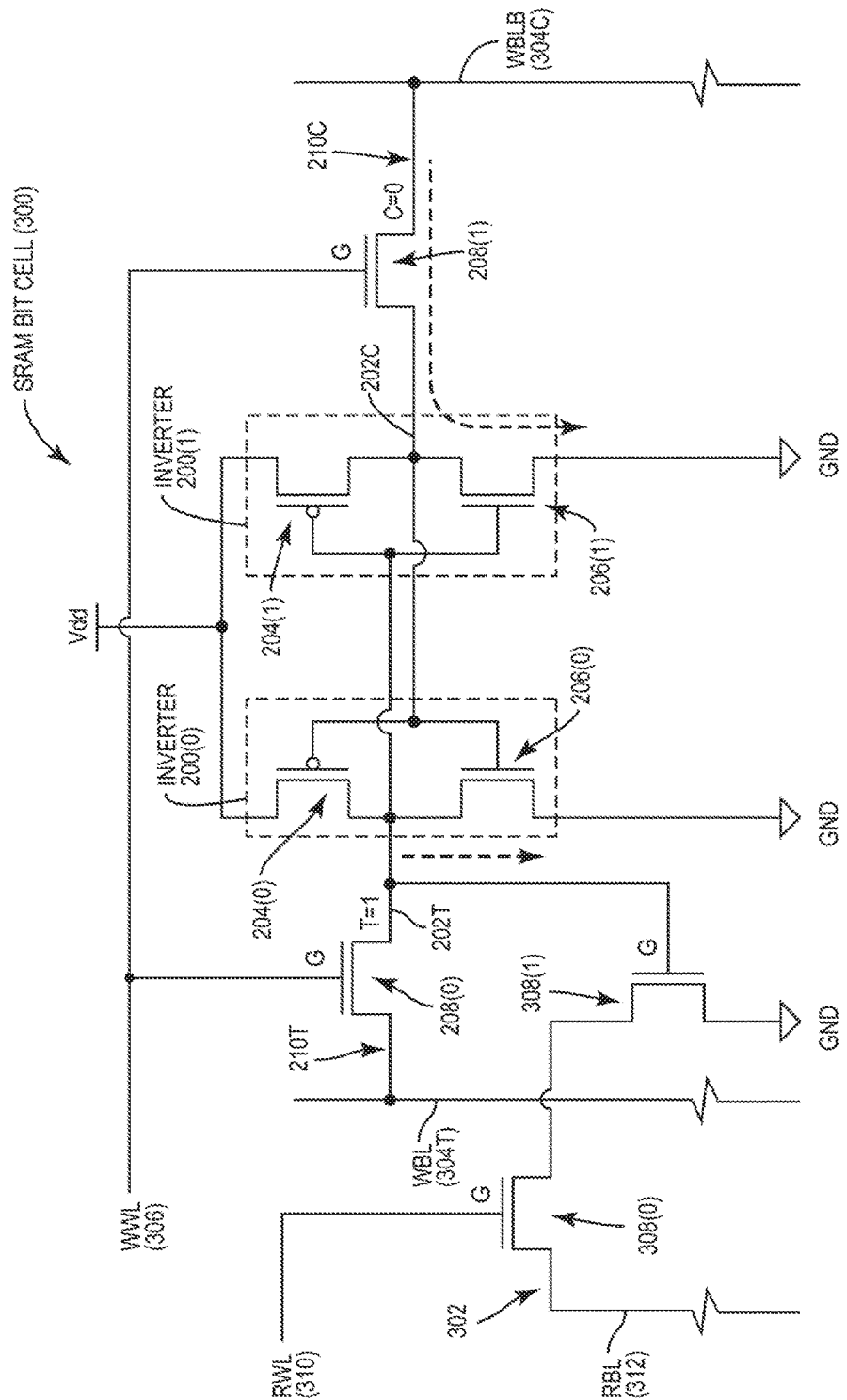
FIG. 3 is a circuit diagram of a multiple port, eight (8) transistor (T) (8T) SRAM bit cell that can be employed in the data array in the SRAM system in FIG. 1.

With continuing reference to FIG. 5, the memory bit cell selection circuit 502 includes a read/write (RD/WR) clock generation circuit 503 in this example. In response to a memory write operation, the RD/WR clock generation circuit 503 is configured to generate a write column select (wr_col_sel <0>-wr_col_sel<M>) 504(0)-504(M) corresponding to the memory bit cell column C(0)-C(M) corresponding to the write column select (wr_col_sel) 434 provided by the read/write decoder circuit 424 in FIG. 4. Also in response to a memory write operation, the RD/WR clock generation circuit 503 is also configured to generate a column write clock signal (col_wr_clk) 506. The generated write column select (wr_col_sel <0>-wr_col_sel<M>) 504(0)-504(M) activates a corresponding write column driver circuit 508(0)-508(M) in the selected memory bit cell column C(0)-C(M) to drive corresponding write data (wr_data) 422 onto bit lines BL(0)(0)-BL(0)(X)-BL(M)(0)-BL(M)(X) and complement bit lines BLB(0)(0)-BLB(0)(X)-BLB(M)(0)-BLB(M)(X) to be written into the memory bit cells 410(0)( )(0)-410(M)( )(X) corresponding to the selected memory bit cell column C(0)-C(M). The memory bit cells 410(0)( )(0)-410(M)( )(X) may be SRAM bit cells for example that only include one access port for performing memory read and write operations. For example, the memory bit cells 410(0)( )(0)-410(M)( )(X) may each be 6T SRAM memory bit cells like or similar to the SRAM bit cell 102 in FIG. 2. The column write clock signal (col_wr_clk) 506 is used by the selected memory bit cell column C(0)-C(M) to drive the operation timing of the write column driver circuit 508(0)-508(M).

With continuing reference to FIG. 5, in response to a memory read operation, the read/write clock generation circuit is configured to generate a bitline pre-charge signal (bl_prech) 510 to cause bitline pre-charger circuits 512(0)-512(M) to pre-charge the bit lines BL(0)(0)-BL(0)(X)-BL (M)(0)-BL(M)(X) and complement bit lines BLB(0)(0)-BLB (0)(X)-BLB(M)(0)-BLB(M)(X). After pre-charging, the RD/WR clock generation circuit 503 is configured to generate a read column select (rd_col_sel <0>-rd_col_sel<M>) 514(0)-514(M) corresponding to the memory bit cell column C(0)-C(M) corresponding to the read column select (rd_col_sel) 428 provided by the read/write decoder circuit 424 in FIG. 4. Also in response to a memory read operation, the RD/WR clock generation circuit 503 is also configured to generate a column read clock signal (col_rd_clk) 516. The generated read column select (rd_col_sel <0>-rd_col_sel<M>) 514(0)-514(M) activates a corresponding read column select circuit 518(0)-518(M) in the selected memory bit cell column C(0)-C(M). The read column select circuit 518(0)-518(M) is configured to select the bit lines BL(0)(0)-BL(0)(X)-BL(M)(0)-BL(M)(X) and complement bit lines BLB(0)(0)-BLB(0)(X)-BLB(M)(0)-BLB(M)(X) corresponding to the selected memory bit cell column C(0)-C(M). The column read clock signal (col_rd_clk) 516 is used by the selected memory bit cell column C(0)-C(M) to drive the operation timing of the read column select circuit 518(0)-518(M). The read column select circuit 518(0)-518(M) may also include sense amplifiers configured to sense the read data (rd_data) 416 asserted on the bit lines BL(0)(0)-BL(0)(X)-BL(M)(0)-BL(M)(X) and complement bit lines BLB(0)(0)-BLB(0)(X)-BLB(M)(0)-BLB(M)(X) by the memory bit cells 410(0)( )(0)-410(M)( )(X) corresponding to the selected memory bit cell column C(0)-C(M).

With continuing reference to FIG. 5, the memory bit cell selection circuit 502 is also configured to select a memory bit cell row R(0)-R(N) in response to a memory read and/or write operation. A word line (WL(0)-WL(N)) 520(0)-520(N) is provided for each memory bit cell row R(0)-R(N) to activate the memory bit cells 410(0)(0)( )-410(0)(N)( ) in a corresponding memory bit cell row R(0)-R(N) for a memory read and/or write operation. The selection of the word line (WL(0)-WL(N)) 520(0)-520(N) is controlled by the corresponding read row select (rd_row_sel<0>-rd_row_sel<N>) 426(0)-426(N) generated by the read/write decoder circuit 424 in FIG. 4 as previously discussed when the memory system 400 is addressed for a memory read operation. The selection of the word line (WL(0)-WL(N)) 520(0)-520(N) is controlled by the corresponding write row select (wr_row_sel<0>-wr_row_sel<N>) 432(0)-432(N) generated by the read/write decoder circuit 424 in FIG. 4 as previously discussed when the memory system 400 is addressed for a memory write operation.

Because only one word line 520(0)-520(N) can be activated at a time in response to a memory read and/or write operation, and the memory sub-array 500 is configured to support simultaneous memory read and write operations, the memory bit cell selection circuit 502 includes a plurality of row selection circuits 522(0)-522(N) each corresponding to a memory bit cell row R(0)-R(N). In this example, the row selection circuits 522(0)-522(N) are multiplexor circuits 524(0)-524(N). The row selection circuits 522(0)-522(N) are each configured to receive a respective read row select (rd_row_sel<0>-rd_row_sel<N>) 426(0)-426(N) and write row select (wr_row_sel<0>-wr_row_sel<N>) 432(0)-432(N) according to the read and/or write memory address of the memory read and/or write operation. The row selection circuits 522(0)-522(N) are also configured to receive a read/write row select 526 corresponding to whether a memory read or write operation is active. In this example, the read/write row select 526 is comprised of a generated word line read clock signal (WL_rd_clk) 528 for a memory read operation and a generated word line read clock signal (WL_rd_clk) 530 for a memory write operation. The RD/WR clock generation circuit 503 is configured to generate the word line read clock signal (WL_rd_clk) 528 and the word line read clock signal (WL_rd_clk) 530 based on the received read clock signal (rd_clk) 430 and write clock signal (wr_clk) 436.

With continuing reference to FIG. 5, because a simultaneous memory read and write operation can result in different memory bit cell rows R(0)-R(N) being selected, the memory bit cell selection circuit 502 is configured to prioritize memory write operations over memory read operations. This avoids more than one (1) memory bit cell row R(0)-R(N) from being activated at the same time in the event that memory read and write operations are to different memory bit cell rows R(0)-R(N). In this regard, the RD/WR clock generation circuit 503 is configured to generate the word line read clock signal (WL_wr_clk) 530 in response to a memory write operation. The RD/WR clock generation circuit 503 is also configured to generate the read clock signal (WL_rd_clk) 528 in response to a memory read operation only if a memory write operation is not present. If a memory write operation is present during a memory write operation, the RD/WR clock generation circuit 503 is configured to suppress the read clock signal (rd_clk) 430 so that the read clock signal (WL_rd_clk) 528 is not generated. The row selection circuits 522(0)-522(N) pass the corresponding write row select (wr_row_sel<0>-wr_row_sel<N>) 432(0)-432(N) on the corresponding word line (WL(0)-WL(N)) 520(0)-520(N) in response to the presence of the word line write clock signal (WL_wr_clk) 530. The row selection circuits 522(0)-522(N) pass the corresponding read row select (rd_row_sel<0>-rd_row_sel<N>) 426(0)-426(N) on the corresponding word line (WL(0)-WL(N)) 520(0)-520(N) in response to the presence of the word line read clock signal (WL_rd_clk) 528 unless the word line write clock signal (WL_rd_clk) 528 is active indicating the presence of a memory write operation.

Figure 6:
FIG. 6 is a table illustrating address conditions in the memory sub-array in FIG. 5 for a simultaneous memory read and write operation.

FIG. 6 is a table 600 illustrating address conditions 602 in the memory sub-array 500 in FIG. 5 for simultaneous memory read and write operations. As shown therein, when the read row select (rd_row_sel) 426 matches the write row select (wr_row_sel) 432 for simultaneous memory read and write operations, the prioritization given to the write row select (wr_row_sel) 432 for selecting the memory bit cell row R(0)-R(N) ensures that the write operation is successful. This is regardless of whether the read column select (rd_col_sel) 428 matches or does not match the write column select (wr_col_sel) 434. In this scenario, if the read column select (rd_col_sel) 428 matches the write column select (wr_col_sel) 434, the write data (wr_data) 422 written to the selected memory bit cell column C(0)-C(M) by the selected write column driver circuit 508(0)-508(M) in FIG. 5 according to the write column select (wr_col_sel) 434 will be passed to the read column select circuit 518(0)-518(M) selected by the read column select (rd_col_sel) 428 for the same memory bit cell column C(0)-C(M). In this scenario, the read column select (rd_col_sel) 428 does not match the write column select (wr_col_sel) 434, the write data (wr_data) 422 will be written to the selected memory bit cell column C(0)-C(M) by the selected write column driver circuit 508(0)-508( ) in FIG. 5 according to the write column select (wr_col_sel) 434. The read data (rd_data) 416 will be sensed by the read column select circuit 518(0)-518(M) selected by the read column select (rd_col_sel) 428 for the different memory bit cell column C(0)-C(M).

With continuing reference to FIG. 6, when the read row select (rd_row_sel) 426 does not match the write row select (wr_row_sel) 432 for simultaneous memory read and write operations, the prioritization given to the write row select (wr_row_sel) 432 for selecting the memory bit cell row R(0)-R(N) still ensures that the write operation is successful. However, the read data (rd_data) 416 sensed by a read column select circuit 518(0)-518(M) selected by the read column select (rd_col_sel) 428 for the memory read operation cannot be relied upon, and is thus considered a read fail. This is because the memory bit cell row R(0)-R(N) for the memory read operation according to the read column select (rd_col_sel) 428 is not selected. Thus, any read data (rd_data) 416 that is sensed by the read column select circuit 518(0)-518(M) would not be from the addressed memory bit cell row R(0)-R(N) for the memory read operation according to the read column select (rd_col_sel) 428.

Figure 7:
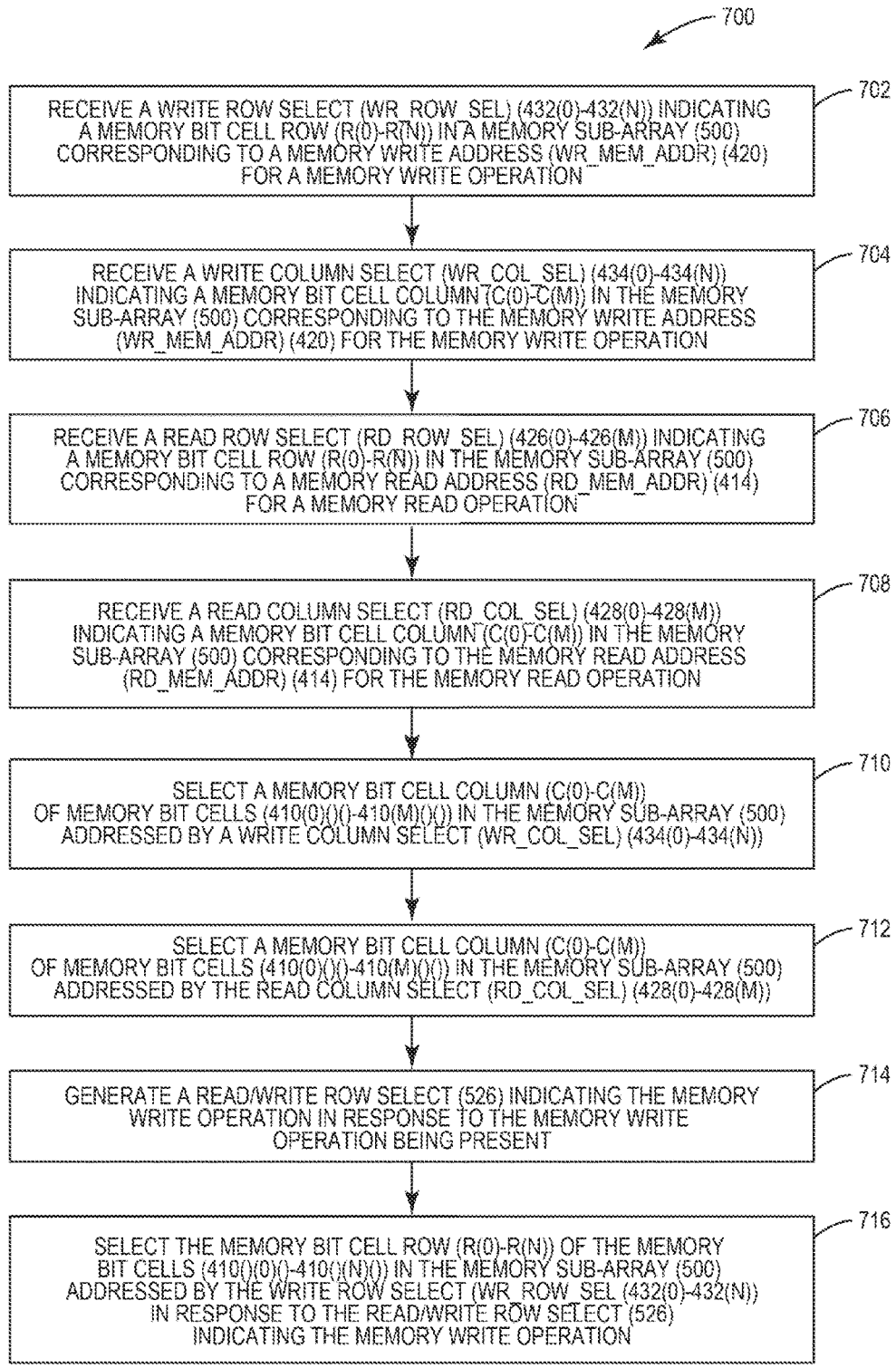
FIG. 7 is a flowchart illustrating an exemplary process of performing a simultaneous memory read and write operation in the memory sub-array in FIG. 5.

FIG. 7 is a flowchart illustrating an exemplary process 700 of performing a simultaneous memory read and write operation in the memory sub-array 500 in FIG. 5. In this regard, the memory bit cell selection circuit 502 receives a write row select (wr_row_sel) 432(0)-432(N) indicating a memory bit cell row R(0)-R(N) in the memory sub-array 500 corresponding to a memory write address (wr_mem_addr) 420 for a memory write operation (block 702). The memory bit cell selection circuit 502 receives a write column select (wr_col_sel) 434(0)-434(N) indicating a memory bit cell column C(0)-C(M) in the memory sub-array 500 corresponding to the memory write address (wr_mem_addr) 420 for the memory write operation (block 704). The memory bit cell selection circuit 502 receives a read row select (rd_row_sel) 426(0)-426(M) indicating a memory bit cell row R(0)-R(N) in the memory sub-array 500 corresponding to a memory read address (rd_mem_addr) 414 for a memory read operation (block 706). The memory bit cell selection circuit 502 receives a read column select (rd_col_sel) 428(0)-428(M) indicating a memory bit cell column C(0)-C(M) in the memory sub-array 500 corresponding to the memory read address (rd_mem_addr) 414) for the memory read operation (block 708). The memory bit cell selection circuit 502 selects a memory bit cell column C(0)-C(M) of memory bit cells 410(0)( )( )-410(M)( )( ) in the memory sub-array 500) addressed by a write column select (wr_col_sel) 434(0)-434(N) (block 710). The memory bit cell selection circuit 502 selects a memory bit cell column C(0)-C(M) of memory bit cells (410(0)( )( )-410(M)( )( )) in the memory sub-array 500 addressed by the read column select (rd_col_sec) 428(0)-428(M) (block 712). The memory bit cell selection circuit 502 generates a read/write row select 526 indicating the memory write operation in response to the memory write operation being present (block 714). The memory bit cell selection circuit 502 selects the memory bit cell row R(0)-R(N) of the memory bit cells 410( )(0)( )-410( )(N)( ) in the memory sub-array 500 addressed by the write row select (wr_row_sel) 432(0)-432(N) in response to the read/write row select 526 indicating the memory write operation (block 716 in FIG. 7).

As discussed above, the memory bit cell selection circuit 502 in FIG. 5, and in particular the RD/WR clock generation circuit 503, is configured to suppress or block the read clock signal (rd_clk) 430 in response to a simultaneous memory read and write operation when a memory write operation is present or active. This is so that the memory write operation can be prioritized as discussed above. The memory write operation may be determined to be present based on the presence of the write clock signal (wr_clk) 436 as an example. Different circuits can be provided in the memory bit cell selection circuit 502 or the RD/WR clock generation circuit 503 in the memory sub-array 500 in FIG. 5 to suppress the read clock signal (rd_clk) 430 when the write clock signal (wr_clk) 430 is not present.

Even with the read clock signal (rd_clk) 430 being suppressed, the same read operation clock timing for the circuits in the memory sub-array 500 in FIG. 5 involved with a read operation by the read clock signal (rd_clk) 430 may need to be maintained. This is because, as discussed above, when the read row select (rd_row_sel) 426 matches the write row select (wr_row_sel) 432 for simultaneous memory read and write operations, the read and write operations can both be performed. However, the timing of the operation of the memory sub-array 500 is based on the read/write row select 526, which is generated to prevent different memory bit cell rows R(0)-R(N) from being activated at the same time.

Figure 8:
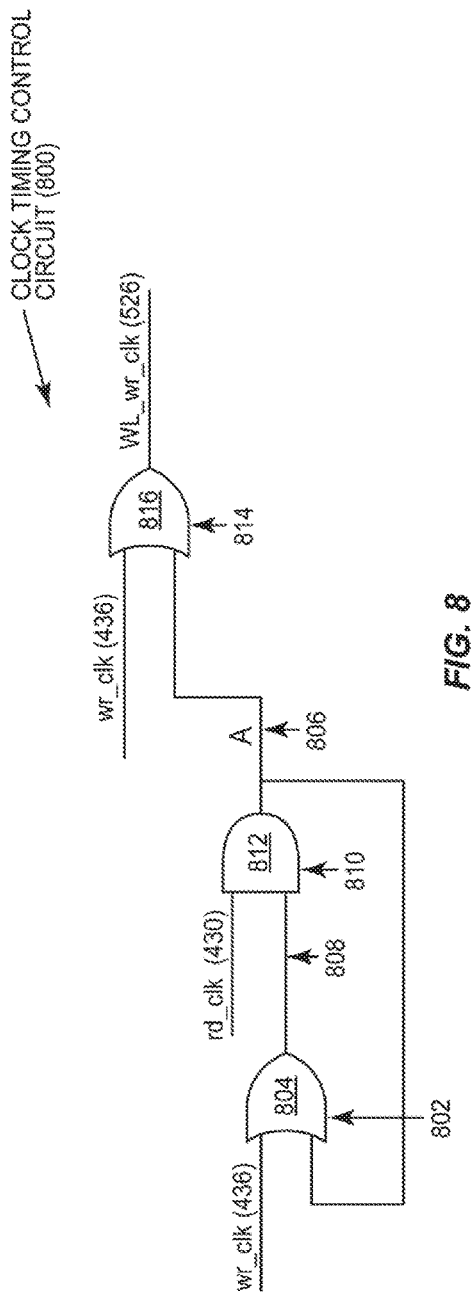
FIG. 8 is a circuit diagram of a clock timing control circuit that can be included in the read/write clock generation circuit in the memory sub-array in FIG. 5 for keeping a write clock signal active during a simultaneous read and write operation as long as a read clock signal is active for the read operation to support simultaneous memory read and write operations to the memory sub-array.

In this regard, FIG. 8 is a circuit diagram of a clock timing control circuit 800 that can be included in the memory bit cell selection circuit 502 or the RD/WR clock generation circuit 503 in the memory sub-array 500 in FIG. 5. As discussed below, the clock timing control circuit 800 keeps the write clock signal (wr_clk) 436 active during a simultaneous read and write operation as long as the read clock signal (rd_clk) 430 is active for the read operation. This is so that the write clock signal (wr_clk) 436 remains active to include the original timing of the read clock signal (rd_clk) 430 for controlling read operations, because the read clock signal (rd_clk) 430 is suppressed to prioritize write operations during a simultaneous read and write operation. The clock timing control circuit 800 is configured to generate the read/write row select 526 to remain active or to be "stretched" based on the presence of both the read clock signal (rd_clk) 430 and the write clock signal (wr_clk) 436 so that the timing is sufficient to perform both a memory read and write operation in the event of a simultaneous memory read and write operation.

As shown in FIG. 8, the clock timing control circuit 800 includes a first OR-based logic circuit 802 in the form of an OR gate 804 in this example. The first OR-based logic circuit 802 is configured to receive the write clock signal (wr_clk) 436 and a second output signal 806 (labeled 'A'), and generate a first output signal 808 based on an OR-based logic operation of the write clock signal (wr_clk) 436 and the second output signal 806. The clock timing control circuit 800 also includes an AND-based logic circuit 810 in the form of an AND gate 812 in this example. The AND-based logic circuit 810 is configured to receive the read clock signal (rd_clk) 430 and the first output signal 808, and generate the second output signal 806 based on an AND-based logic operation of the read clock signal (rd_clk) 430 and the first output signal 808. The clock timing control circuit 800 also includes a second OR-based logic circuit 814 in the form of an OR gate 816 in this example. The second OR-based logic circuit 814 is configured to receive the write clock signal (wr_clk) 436 and the second output signal 806, and generate the read/write row select 526 based on an OR-based logic operation of the write clock signal (wr_clk) 436 and the second output signal 806.

Figure 9:
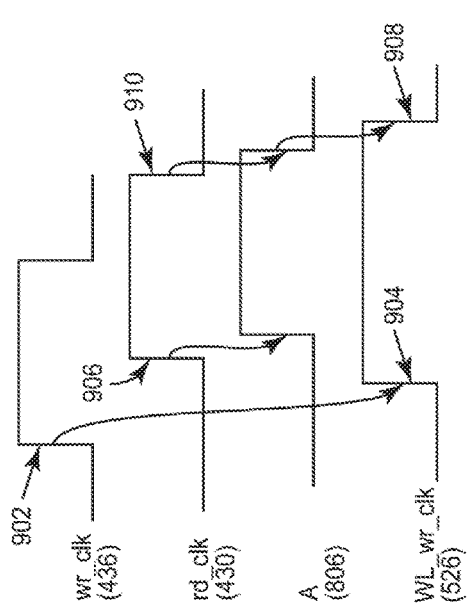
FIG. 9 is a timing diagram illustrating an exemplary timing of signals generated by the clock timing control circuit in FIG. 8 in response to a read clock signal and a write clock signal.

FIG. 9 is a timing diagram 900 illustrating an exemplary timing of signals generated by the clock timing control circuit 800 in FIG. 8 in response to the read clock signal (rd_clk) 430 and the write clock signal (wr_clk) 436. In response to a rising edge 902 of the write clock signal (wr_clk) 436, the clock timing control circuit 800 is configured to generate a rising edge 904 of the read/write row select 526. A rising edge 906 of the read clock signal (rd_clk) 430 causes the AND-based logic circuit 810 to generate the second output signal (A) 806 in the clock timing control circuit 800 in FIG. 8. The second output signal (A)

806 is used to control a falling edge 908 of the read/write row select 526 to stretch the read/write row select 526 to be active when the read clock signal (rd_clk) 430 is active. In this regard, the read/write row select 526 remains in an active state until a falling edge 910 of the second output signal (A) 806 caused by the inactivity of the read clock signal (rd_clk) 430. This causes the OR-based logic circuit 814 in the clock timing control circuit 800 in FIG. 8 to generate the falling edge 908 of the read/write row select 526.

A memory bit cell selection circuit for a memory system that is configured to receive read and write row and column selects and prioritize a write row select over a read row select to support simultaneous memory read and write operations can be provided by other circuits and examples, including those in FIGS. 4, 5, and 8. For example, such a memory bit cell selection circuit may include a means for receiving a write row select indicating a memory bit cell row among a plurality of memory bit cell rows in a memory array corresponding to a memory write address for a memory write operation. The memory bit cell selection circuit may also include a means for receiving a write column select indicating a memory bit cell column among a plurality of memory bit cell columns in the memory array corresponding to the memory write address for the memory write operation. The memory bit cell selection circuit may also include a means for selecting the memory bit cell column of memory bit cells in the memory array addressed by the means for receiving the write column select. The memory bit cell selection circuit may also include a means for generating a read/write row select indicating the memory write operation. The memory bit cell selection circuit may also include a means for receiving a read row select indicating a memory bit cell row among the plurality of memory bit cell rows in the memory array corresponding to a memory read address for a memory read operation. The memory bit cell selection circuit may also include a means for receiving a read column select indicating a memory bit cell column among the plurality of memory bit cell columns in the memory array corresponding to the memory read address for the memory read operation. The memory bit cell selection circuit may also include a means for selecting the memory bit cell column of memory bit cells in the memory array addressed by the means for receiving the read column select. The memory bit cell selection circuit may also include a means for generating a read/write row select indicating the memory read operation in response to the memory write operation not being present for the memory read operation. The memory bit cell selection circuit may also include a means for selecting the memory bit cell row of the memory bit cells in the memory array addressed by the write column select in response to the means for generating the read/write row select indicating the memory write operation. The memory bit cell selection circuit may also include a means for selecting the memory bit cell row of the memory bit cells in the memory array addressed by the read column select in response to the means for generating the read/write row select indicating the memory read operation.

Note that although the examples of memory systems configured to separately decode read and write addresses into read and write row and column selects, and prioritize a write row select over a read row select to support simultaneous memory read and write operations, are shown with SRAM bit cells above, such memory systems are not limited to SRAM bit cells. Such memory systems may include other types of memory bit cells, including but not limited to magneto resistive random access memory (MRAM) bit cells, and dynamic random access memory (DRAM) bit cells.

Memory systems configured to separately decode read and write addresses into read and write row and column selects, and prioritize a write row select over a read row select to support simultaneous memory read and write operations, including but not limited to the memory system 400 in FIGS. 4 and 5, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
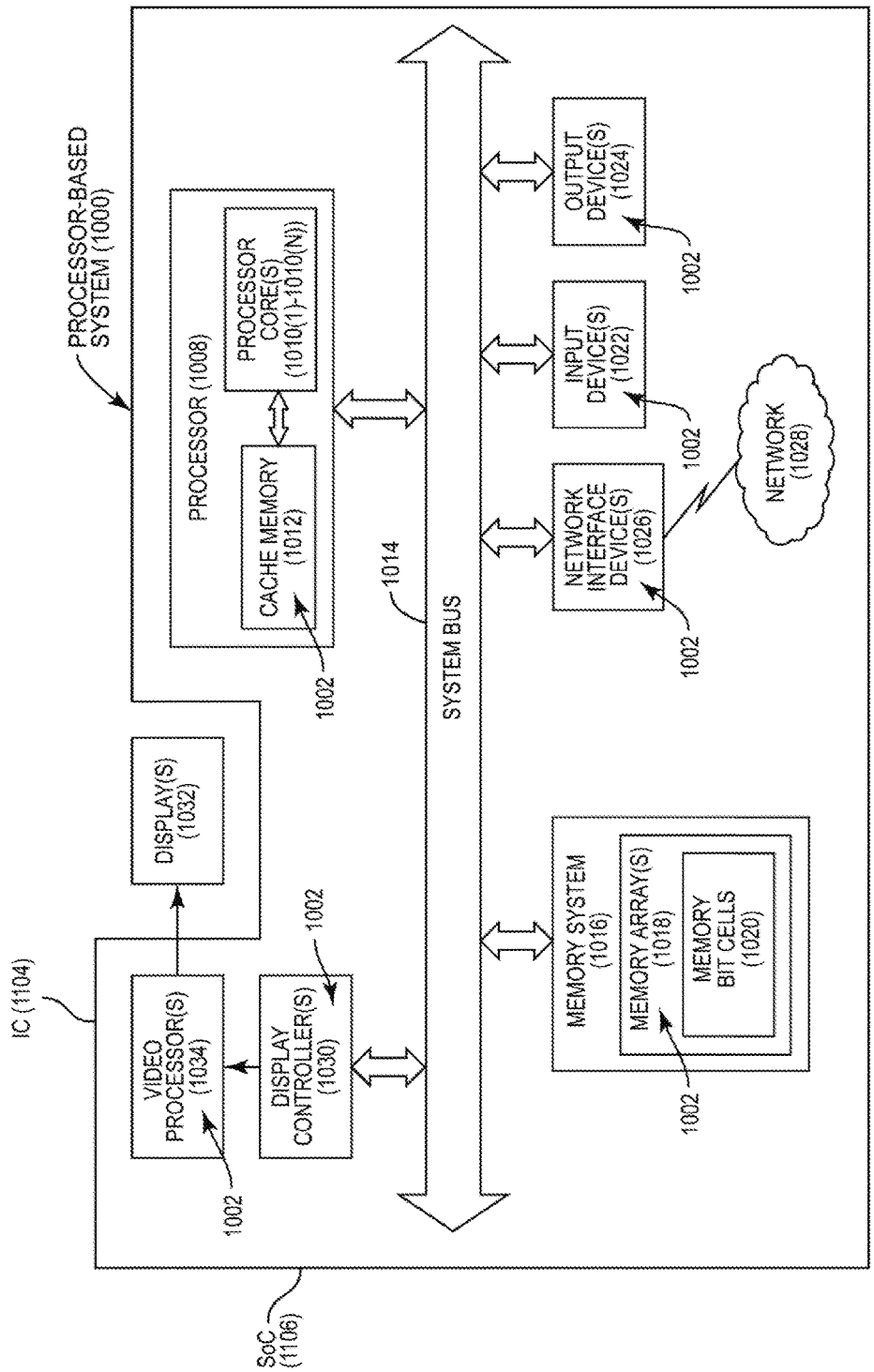
FIG. 10 is a block diagram of an exemplary processor-based system that can include a memory system configured to separately decode read and write addresses into read and write row and column selects and prioritize a write row select over a read row select to support simultaneous memory read and write operations, including but not limited to the memory systems in FIGS. 4 and 5.

In this regard, FIG. 10 illustrates an example of a processor-based system 1000 that can include circuits that include memory systems configured to separately decode read and write addresses into read and write row and column selects, and prioritize a write row select over a read row select to support simultaneous memory read and write operations, including but not limited to the memory system 400 in FIGS. 4 and 5. For example, the processor-based system 1000 includes one or more memory systems 1002 configured to separately decode read and write addresses into read and write row and column selects, and prioritize a write row select over a read row select to support simultaneous memory read and write operations, including but not limited to the memory system 400 in FIGS. 4 and 5.

In this example, the processor-based system 1000 is provided in an IC 1004. The IC 1004 may be included in or provided as a SoC 1006. The processor-based system 1000 includes a CPU or processor 1008 that includes one or more processor cores 1010(1)-1010(N). The processor 1008 may have a cache memory 1012 coupled to the processor cores 1010(1)-1010(N) for rapid access to temporarily stored data. The cache memory 1012 may include the memory system 1002 configured to separately decode read and write addresses into read and write row and column selects, and prioritize a write row select over a read row select to support simultaneous memory read and write operations, including but not limited to the memory system 400 in FIGS. 4 and 5. The processor 1008 is coupled to a system bus 1014 and can intercouple master and slave devices included in the processor-based system 1000. As is well known, the processor 1008 communicates with these other devices by exchanging address, control, and data information over the system bus 1014. Although not illustrated in FIG. 10, multiple system buses 1014 could be provided, wherein each system bus 1014 constitutes a different fabric. For example, the processor 1008 can communicate bus transaction requests to the memory system 1002 as an example of a slave device.

Other master and slave devices can be connected to the system bus 1014 in the processor-based system 1000. As illustrated in FIG. 10, these devices can include a memory system 1016. The memory system 1016 can include a memory system 1002 configured to separately decode read and write addresses into read and write row and column selects, and prioritize a write row select over a read row select to support simultaneous memory read and write operations, including but not limited to the memory system 400 in FIGS. 4 and 5. The memory system 1016 includes one or more memory arrays 1018 each comprising a plurality of memory bit cells 1020. The memory bit cells 1020 may be SRAM bit cells, and may be 6T SRAM bit cells as an example.

With continuing reference to FIG. 10, the slave devices in the processor-based system 1000 can also include one or more input devices 1022. The input device(s) 1022 can include any type of input device, including but not limited to input keys, switches, voice processors, etc. The input device(s) 1022 can include a memory system 1002 configured to separately decode read and write addresses into read and write row and column selects, and prioritize a write row select over a read row select to support simultaneous memory read and write operations, including but not limited to the memory system 400 in FIGS. 4 and 5. The slave devices can also include one or more output devices 1024 and one or more network interface devices 1026, each of which can include a memory system 1002 configured to separately decode read and write addresses into read and write row and column selects, and prioritize a write row select over a read row select to support simultaneous memory read and write operations, including but not limited to the memory systems in FIGS. 4 and 5. The output device(s) 1024 can include any type of output device, including but not limited to audio, video, other visual indicators, etc. The network interface device(s) 1026 can be any devices configured to allow exchange of data to and from a network 1028. The network 1028 can be any type of network, including but not limited to a wired or wireless network, a private or public network, a local area network (LAN), a wireless local area network (WLAN), a wide area network (WAN), a BLUETOOTH™ network, and the Internet. The network interface device(s) 1026 can be configured to support any type of communications protocol desired.

Other slave devices that can be included in the processor-based system 1000 can also include one or more display controllers 1030 as examples. The display controller(s) 1030 include a memory system 1002 configured to separately decode read and write addresses into read and write row and column selects, and prioritize a write row select over a read row select to support simultaneous memory read and write operations, including but not limited to the memory system 400 in FIGS. 4 and 5. The processor 1008 may be configured to access the display controller(s) 1030 over the system bus 1014 to control information sent to one or more displays 1032. The display(s) 1032 can include any type of display, including but not limited to a cathode ray tube (CRT), a liquid crystal display (LCD), a plasma display, etc. The display controller(s) 1030 sends information to the display(s) 1032 to be displayed via one or more video processors 1034, which process the information to be displayed into a format suitable for the display(s) 1032. The video processor(s) 1034 may include a memory system 1002 configured to separately decode read and write addresses into read and write row and column selects, and prioritize a write row select over a read row select to support simultaneous memory read and write operations, including but not limited to the memory system 400 in FIGS. 4 and 5.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A memory bit cell selection circuit for a memory system, the memory bit cell selection circuit configured to:
   in response to a memory write operation:
      receive a write row select indicating a memory bit cell row among a plurality of memory bit cell rows in a memory array corresponding to a memory write address for the memory write operation;
      receive a write column select indicating a memory bit cell column among a plurality of memory bit cell columns in the memory array corresponding to the memory write address for the memory write operation;
      select the memory bit cell column of memory bit cells in the memory array addressed by the write column select; and
      generate a read/write row select indicating the memory write operation; and
      select the memory bit cell row of memory bit cells in the memory array addressed by the write row select in response to the read/write row select indicating the memory write operation; and
   in response to a memory read operation:
      receive a read row select indicating a memory bit cell row among the plurality of memory bit cell rows in the memory array corresponding to a memory read address for the memory read operation;
      receive a read column select indicating a memory bit cell column among the plurality of memory bit cell columns in the memory array corresponding to the memory read address for the memory read operation;
      select the memory bit cell column of memory bit cells in the memory array addressed by the read column select;
      generate a read/write row select indicating the memory read operation in response to the memory write operation not being present for the memory read operation; and
      select the memory bit cell row of the memory bit cells in the memory array addressed by the read row select in response to the read/write row select indicating the memory read operation.

2. The memory bit cell selection circuit of claim 1 configured to simultaneously receive the write row select and the write column select for the memory write operation, and the read row select and the read column select for the memory read operation.

3. The memory bit cell selection circuit of claim 2 configured to generate the read/write row select indicating the memory write operation in response to simultaneous receipt of the write row select and the write column select for the memory write operation, and the read row select and the read column select for the memory read operation.

4. The memory bit cell selection circuit of claim 1, comprising a read/write clock generation circuit further configured to:
   in response to the memory write operation:
      receive a write clock signal; and
      provide the write clock signal to the selected memory bit cell column for the memory write operation; and
   in response to the memory read operation:
      receive a read clock signal; and
      provide the read clock signal to the selected memory bit cell column for the memory read operation.

5. The memory bit cell selection circuit of claim 4, wherein the read/write clock generation circuit is further configured to:
   generate the read/write row select based on the write clock signal in response to the memory write operation; and
   generate the read/write row select based on the read clock signal in response to the memory read operation.

6. The memory bit cell selection circuit of claim 4, wherein the read/write clock generation circuit comprises a clock timing control circuit configured to:
   in response to receiving the write clock signal, generate the read/write row select based on the write clock signal in response to the memory write operation; and
   in response to receiving the read clock signal:
      generate the read/write row select based on the write clock signal in response to receiving the write clock signal; and
      generate the read/write row select based on the read clock signal in response to not receiving the write clock signal.

7. The memory bit cell selection circuit of claim 6, wherein the clock timing control circuit comprises:
   a first OR-based logic circuit configured to receive a word line write clock signal based on the write clock signal and a second output signal, and generate a first output signal based on an OR-based logic operation of the word line write clock signal and the second output signal;
   an AND-based logic circuit configured to receive a word line read clock signal based on the read clock signal and the first output signal, and generate the second output signal based on an AND-based logic operation of the word line read clock signal and the first output signal; and
   a second OR-based logic circuit configured to receive the word line write clock signal and the second output signal, and generate the read/write row select based on the OR-based logic operation of the word line write clock signal and the second output signal.

8. The memory bit cell selection circuit of claim 1, comprising a plurality of memory bit cell selection circuits each corresponding to a memory bit cell row among the plurality of memory bit cell rows in the memory array;
   each memory bit cell selection circuit among the plurality of memory bit cell selection circuits configured to:
      receive a read row select corresponding to the memory bit cell row for the memory bit cell selection circuit;
      receive a write row select corresponding to the memory bit cell row for the memory bit cell selection circuit;
      receive the read/write row select;
      select the write row select to be asserted to the corresponding memory bit cell row in response to the read/write row select indicating the memory write operation; and select the read row select to be asserted to the corresponding memory bit cell row in response to the read/write row select indicating the memory read operation.

9. The memory bit cell selection circuit of claim 8, wherein the plurality of memory bit cell selection circuits each comprising a multiplexor circuit corresponding to the memory bit cell row among the plurality of memory bit cell rows in the memory array, each multiplexor circuit configured to:
   pass the received write row select to the corresponding memory bit cell row in response to the read/write row select indicating the memory write operation; and
   pass the received read row select to the corresponding memory bit cell row in response to the read/write row select indicating the memory read operation.

10. The memory bit cell selection circuit of claim 1 integrated into an integrated circuit (IC).

11. The memory bit cell selection circuit of claim 1 integrated into a system-on-a-chip (SoC).

12. The memory bit cell selection circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device (e.g., a smart watch, a health or fitness tracker, eyewear, etc.); a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

13. A memory bit cell selection circuit for a memory system, the memory bit cell selection circuit comprising:
   a means for receiving a write row select indicating a memory bit cell row among a plurality of memory bit cell rows in a memory array corresponding to a memory write address for a memory write operation;
   a means for receiving a write column select indicating a memory bit cell column among a plurality of memory bit cell columns in the memory array corresponding to the memory write address for the memory write operation;
   a means for selecting the memory bit cell column of memory bit cells in the memory array addressed by the means for receiving the write column select;
   a means for generating a read/write row select indicating the memory write operation;
   a means for receiving a read row select indicating a memory bit cell row among the plurality of memory bit cell rows in the memory array corresponding to a memory read address for a memory read operation;
   a means for receiving a read column select indicating a memory bit cell column among the plurality of memory bit cell columns in the memory array corresponding to the memory read address for the memory read operation;
   a means for selecting the memory bit cell column of memory bit cells in the memory array addressed by the means for receiving the read column select;
   a means for generating a read/write row select indicating the memory read operation in response to the memory write operation not being present for the memory read operation;
   a means for selecting the memory bit cell row of the memory bit cells in the memory array addressed by the write row select in response to the means for generating the read/write row select indicating the memory write operation; and
   a means for selecting the memory bit cell row of the memory bit cells in the memory array addressed by the read row select in response to the means for generating the read/write row select indicating the memory read operation.

14. A method of performing a memory read and write operation to a memory array in a memory system, comprising:
   receiving a write row select indicating a memory bit cell row among a plurality of memory bit cell rows in a memory array corresponding to a memory write address for a memory write operation;
   receiving a write column select indicating a memory bit cell column among a plurality of memory bit cell columns in the memory array corresponding to the memory write address for the memory write operation;
   receiving a read row select indicating a memory bit cell row among the plurality of memory bit cell rows in the memory array corresponding to a memory read address for a memory read operation;
   receiving a read column select indicating a memory bit cell column among the plurality of memory bit cell columns in the memory array corresponding to the memory read address for the memory read operation;
   selecting the memory bit cell column of memory bit cells in the memory array addressed by the write column select;
   selecting the memory bit cell column of memory bit cells in the memory array addressed by the read column select;
   generating a read/write row select indicating the memory write operation in response to the memory write operation being present; and
   selecting the memory bit cell row of the memory bit cells in the memory array addressed by the write row select in response to the read/write row select indicating the memory write operation.

15. The method of claim 14, further comprising:
   generating the read/write row select indicating the memory read operation in response to the memory write operation not being present for the memory read operation; and
   selecting the memory bit cell row of the memory bit cells in the memory array addressed by the read row select in response to the read/write row select indicating the memory read operation.

16. The method of claim 14, comprising simultaneously receiving the write row select for the memory write operation and receiving the read row select for the memory read operation.

17. The method of claim 14, comprising simultaneously receiving the write column select for the memory write operation and receiving the read column select for the memory read operation.

18. The method of claim 14, further comprising:
in response to the memory write operation:
further comprising receiving a write clock signal; and
generating the read/write row select indicating the memory write operation comprises providing the write clock signal to the selected memory bit cell column for the memory write operation; and
in response to the memory read operation:
further comprising receiving a read clock signal; and
generating the read/write row select indicating the memory read operation comprises providing the read clock signal to the selected memory bit cell column for the memory read operation.

19. The method of claim 18, comprising simultaneously receiving the write clock signal for the memory write operation and receiving the read clock signal for the memory read operation.

20. The method of claim 18, further comprising:
generating the read/write row select comprising the write clock signal in response to the memory write operation; and
generating the read/write row select comprising the read clock signal in response to the memory read operation.

21. A memory system, comprising:
a memory array comprising a plurality of memory bit cells organized into a plurality of memory bit cell rows and a plurality of memory bit cell columns;
a read/write decoder circuit configured to:
decode a memory read address in a memory read operation into:
a read row select indicating a memory bit cell row among the plurality of memory bit cell rows in the memory array corresponding to the memory read address; and
a read column select indicating a memory bit cell column among the plurality of memory bit cell columns in the memory array corresponding to the memory read address; and
decode a memory write address in a memory write operation into:
a write row select indicating a memory bit cell row among the plurality of memory bit cell rows in the memory array corresponding to the memory write address; and
a write column select indicating a memory bit cell column among the plurality of memory bit cell columns in the memory array corresponding to the memory write address; and
at least one memory bit cell selection circuit each configured to:
in response to the memory write operation:
select a memory bit cell column among the plurality of memory bit cell columns in the memory array addressed by the write column select;
generate a read/write row select indicating the memory write operation; and
select a memory bit cell row among the plurality of memory bit cell rows in the memory array addressed by the write row select in response to the read/write row select indicating the memory write operation; and
in response to the memory read operation:
select a memory bit cell column among the plurality of memory bit cell columns in the memory array addressed by the read column select;
generate a read/write row select indicating the memory read operation in response to the memory write operation not being present for the memory read operation; and
select a memory bit cell row of memory bit cells in the memory array addressed by the read row select in response to the read/write row select indicating the memory read operation.

22. The memory system of claim 21, wherein:
the read/write decoder circuit is configured to simultaneously decode the memory read address into the read row select and the read column select, and decode the memory write address into the write row select indicating the write column select; and
the memory bit cell selection circuit is configured to simultaneously receive the write row select and the write column select for the memory write operation, and the read row select and the read column select for the memory read operation.

23. The memory system of claim 22 configured to generate the read/write row select indicating the memory write operation in response to simultaneous receipt of the write row select and the write column select for the memory write operation, and the read row select and the read column select for the memory read operation.

24. The memory system of claim 21 further configured to:
read data for the memory read operation onto a plurality of bitlines of the selected memory bit cell column corresponding to the read column select, from memory bit cells in the memory array from the selected memory bit cell row corresponding to the read row select and the selected memory bit cell column corresponding to the read column select; and
store write data for the memory write operation from a plurality of bitlines of the selected memory bit cell column corresponding to the write column select, to memory bit cells in the memory array to the selected memory bit cell row corresponding the write row select and the selected memory bit cell column corresponding to the write column select.

25. The memory system of claim 24, wherein the memory array is further configured to provide the write data as the read data to the plurality of bitlines of the selected memory bit cell column corresponding to the write column select, in response to the write row select matching the read row select and the write column select matching the read column select.

26. The memory system of claim 24, wherein the memory array is further configured to provide the read data to the plurality of bitlines of the selected memory bit cell column corresponding to the read column select, in response to the write row select matching the read row select and the write column select not matching the read column select.

27. The memory system of claim 24, wherein the memory array is further configured to ignore the read data from the plurality of bitlines of the selected memory bit cell column corresponding to the read column select, in response to the write row select not matching the read row select.

28. The memory system of claim 21, wherein:
the read/write decoder circuit is further configured to:
generate a write clock signal in response to the memory write operation; and
generate a read clock signal in response to the memory read operation; and the at least one memory bit cell selection circuit comprises a read/write clock generation circuit configured to:
   in response to the memory write operation:
      receive the write clock signal; and
      provide the write clock signal to the selected memory bit cell column for the memory write operation; and
   in response to the memory read operation:
      receive the read clock signal; and
      provide the read clock signal to the selected memory bit cell column for the memory read operation.

29. The memory system of claim 21, wherein the at least one memory bit cell selection circuit comprises a plurality of memory bit cell selection circuits each corresponding to a memory bit cell row among the plurality of memory bit cell rows in the memory array;
   each memory bit cell selection circuit among the plurality of memory bit cell selection circuits configured to:
      receive a read row select corresponding to a memory bit cell row for the memory bit cell selection circuit;
      receive a write row select corresponding to a memory bit cell row for the memory bit cell selection circuit;
      receive the read/write row select;
      select the write row select to be asserted to the corresponding memory bit cell row in response to the read/write row select indicating the memory write operation; and
      select the read row select to be asserted to the corresponding memory bit cell row in response to the read/write row select indicating the memory read operation.

30. The memory system of claim 21, wherein:
   the memory array comprises a plurality of memory sub-arrays each comprising a uniquely addressable subset of the plurality of memory bit cells organized into the plurality of memory bit cell rows and the plurality of memory bit cell columns; and
   the at least one memory bit cell selection circuit comprises a plurality of memory bit cell selection circuits each associated with a memory sub-array among the plurality of memory sub-arrays.

31. The memory system of claim 21, wherein the plurality of memory bit cells comprises a plurality of static random access memory (SRAM) bit cells.

32. The memory system of claim 31, wherein the plurality of SRAM bit cells comprises a plurality of six (6) transistor (T) (6T) SRAM bit cells.

\* \* \* \* \*